(12) United States Patent
Daicho et al.

(10) Patent No.: US 8,262,935 B2
(45) Date of Patent: *Sep. 11, 2012

(54) PHOSPHOR AND LIGHT EMITTING DEVICE

(75) Inventors: Hisayoshi Daicho, Shizuoka (JP);
Takeshi Iwasaki, Shizuoka (JP);
Kiminori Enomoto, Shizuoka (JP); Yu Shinomiya, Shizuoka (JP); Shinobu Aoyagi, Nagoya (JP)

(73) Assignee: Koito Manufacturing Co., Ltd., Tokyo (JP)

( * ) Notice: Subject to any disclaimer, the term of this patent is extended or adjusted under 35 U.S.C. 154(b) by 61 days.

This patent is subject to a terminal disclaimer.

(21) Appl. No.: 12/838,779

(22) Filed: Jul. 19, 2010

(65) Prior Publication Data
US 2011/0025193 A1 Feb. 3, 2011

(30) Foreign Application Priority Data
Jul. 31, 2009 (JP) .................... 2009-178726

(51) Int. Cl.
*C09K 11/08* (2006.01)
*C09K 11/61* (2006.01)
(52) U.S. Cl. .................... 252/301.4 H; 252/301.4 F
(58) Field of Classification Search ........... 252/301.4 R, 252/301.6 R, 301.6 F, 301.4 F, 301.4 H; 313/467, 313/468
See application file for complete search history.

(56) References Cited

U.S. PATENT DOCUMENTS

| 7,704,411 B2* | 4/2010 | Daicho et al. ........... 252/301.4 R |
| 2007/0145879 A1 | 6/2007 | Abramov et al. |
| 2008/0253951 A1 | 10/2008 | Daicho et al. |
| 2009/0015138 A1* | 1/2009 | Daicho et al. .............. 313/503 |
| 2009/0127508 A1* | 5/2009 | Kubel .................. 252/301.4 H |

FOREIGN PATENT DOCUMENTS

| EP | 2075313 A1 | 7/2009 |
| JP | 2009-038348 A | 2/2009 |
| WO | WO 2007135926 A1 | 11/2007 |

OTHER PUBLICATIONS

Communication dated Nov. 14, 2011 from the European Patent Office in counterpart European application No. 10170103.5.

* cited by examiner

*Primary Examiner* — Emily Le
*Assistant Examiner* — Lynne Edmondson
(74) *Attorney, Agent, or Firm* — Sughrue Mion, PLLC

(57) ABSTRACT

A phosphor includes a composition represented by the formula: $(M^2_x, M^3_y, M^4_z)_m M^1 O_3 X_{(2/n)}$, wherein $M^1$ is Si and may include at least one element selected Ge, Ti, Zr, and Sn; $M^2$ is Ca and may include at least one element selected Mg, Ba, and Zn; $M^3$ is Sr and may include at least one element selected from the group consisting of Mg, Ba, and Zn; X is at least one kind of halogen element; $M^4$ is $Eu^{2+}$ and may includes at least one element rare-earth elements and Mn, wherein m is in a range of $6/6 \leq m \leq 8/6$; n is in a range of $5 \leq n \leq 7$; and x, y, and z satisfies $x+y+z=1$, where $0<x<1$, $0<y<1$, and $0.01 \leq z \leq 0.3$.

6 Claims, 7 Drawing Sheets

PHOSPHOR AND LIGHT EMITTING DEVICE

BACKGROUND OF THE INVENTION

1. Technical Field

Devices and compositions consistent with the present invention relate to phosphors and, more particularly, to phosphors that are efficiently excited by ultraviolet light or short-wavelength visible light to emit light, and a light emitting device using the phosphor.

2. Description of the Related Art

Various light emitting devices have been known that are configured to obtain desired color light by combining light emitting elements and phosphors, which are excited by light emitted from the light emitting elements and generate light having a wavelength range different from the wavelength range of the light emitted from the light emitting elements.

Particularly, in recent years, a light emitting device, which is configured to obtain white light by combining a semiconductor light emitting element, such as a light-emitting diode (LED) or a laser diode (LD), and a phosphor, has attracted attention as a white light emitting device that has long life and low power consumption. The semiconductor light emitting element emits ultraviolet light or short-wavelength visible light, and the phosphor uses ultraviolet light or short-wavelength visible light as an excitation light source.

As a specific example of the white light emitting device, a light emitting device has been known in which an LED for emitting ultraviolet light or short-wavelength visible light is combined with a plurality of phosphors that is excited by the ultraviolet light or short-wavelength visible light and respectively emits color light, such as blue light or yellow light (see e.g., JP-A-2009-38348 and its counterpart U.S. Pat. Pub. No. US2009/0015138 A1)

However, the emission spectrum of the phosphor, which is used for the above-mentioned white light emitting device and emits yellow light, does not correspond to a luminosity curve, and the peak wavelength of the emission spectrum of the phosphor is shifted toward a long wavelength side as compared to a wavelength where luminosity becomes maximum. For this reason, the conversion efficiency of a single phosphor is good, but the white light emitting device has been needed to be improved in terms of luminous flux and light emission efficiency.

SUMMARY OF THE INVENTION

Exemplary embodiments of the present invention address the above disadvantages and other disadvantages not described above. However, the present invention is not required to overcome the disadvantages described above, and thus, an exemplary embodiment of the present invention may not overcome any of the problems described above.

Accordingly, it is an illustirave aspect of the present invention to provide a phosphor that emits light of which an emission spectrum has a peak wavelength closer to a wavelength where luminosity becomes maximum.

According to one or more illustrative aspects of the present invention, there is provided a phosphor. The phosphor includes a composition represented by the formula: $(M^2{}_x, M^3{}_y, M^4{}_z)_m M^1 O_3 X_{(2/n)}$, wherein $M^1$ is Si and may also include at least one element selected from the group consisting of Ge, Ti, Zr, and Sn; wherein $M^2$ is Ca and may also include at least one kind of element selected from the group consisting of Mg, Ba, and Zn; wherein $M^3$ is Sr and may also include at least one kind of element selected from the group consisting of Mg, Ba, and Zn; wherein X is at least one kind of halogen element; wherein $M^4$ is $Eu^{2+}$ may also include at least one element selected from the group consisting of rare-earth elements and Mn, wherein m is in a range of $6/6 \leq m \leq 8/6$; n is in a range of $5 \leq n \leq 7$; and x, y, and z satisfies x+y+z=1, where 0<x<1, 0<<y<1, and $0.01 \leq z \leq 0.3$.

If the ionic radii of the principal elements of $M^2$, $M^3$, and $M^4$ satisfy the expression $M^2 < M^3 \cong M^4$, x, y, and z may be values satisfying the expression 0.50<x/(y+z)<0.8. For example, if $M^1$ is Si, X is Cl, $M^2$ is Ca, $M^3$ is Sr, and $M^4$ is $Eu^{2+}$, ionic radii of bivalent metal ions satisfy $M^2 < M^3 \cong M^4$ and the intensity of a crystal field is changed by a composition ratio that is represented by x and (y+z). As a result, the peak wavelength of the emission spectrum is shifted by the composition ratio. Specifically, if the expression x>(y+z) is satisfied, a ratio of elements having a small ionic radius is increased and the emission spectrum is shifted toward a longer wavelength. Meanwhile, if the expression x<(y+z) is satisfied, a ratio of elements having a large ionic radius is increased and the emission spectrum is shifted toward a shorter wavelength. Since the emission spectrum of a yellow phosphor in the related art has a peak wavelength closer to the long wavelength side than the peak wavelength of the luminosity curve, a phosphor is required which has a peak wavelength closer to the short wavelength. Accordingly, it may be possible to shift the peak wavelength of emitted light toward the short wavelength side by increasing a ratio of elements having a large ionic radius in the phosphor represented by the above-mentioned formula. Meanwhile, if x/(y+z) is larger than 0.50, sufficient emission intensity is obtained without the generation of many impurities during the synthesis. Meanwhile, if x/(y+z) is smaller than 0.80, there is obtained a phosphor of which the peak wavelength of the emission spectrum is shifted toward the short wavelength side as compared to the peak wavelength of the emission spectrum of the phosphor in the related art.

If a principal halogen element of X is Cl, a ratio $X_{Br}$ of Br in the halogen elements X may satisfy the expression $0.1 < X_{Br} < 0.3$. For example, if $M^1$ is Si, $M^2$ is Ca, $M^3$ is Sr, $M^4$ is $Eu^{2+}$, and X is Cl and Br, ionic radii of Cl and Br satisfy the expression Cl<Br and the distortion of the crystal lattice is changed by the composition ratios thereof. As a result, the peak wavelength of the emission spectrum is shifted by the composition ratios. That is, if a part of Cl, which is a halogen element X, is substituted with another halogen element having a large ionic radius, it may be possible to shift the peak wavelength of the emission spectrum toward the short wavelength as compared to the structure where the halogen element X is formed of Cl alone. Meanwhile, if $X_{Br}$ is larger than 0.10, there is obtained a phosphor of which the peak wavelength of the emission spectrum is shifted toward the short wavelength side as compared to the peak wavelength of the emission spectrum of the phosphor in the related art and which emits light of which the emission spectrum is advantageous in terms of luminosity. Meanwhile, if $X_{Br}$ is smaller than 0.30, there is obtained a phosphor that emits light having sufficient light emission intensity without the generation of many impurities during the synthesis.

According to one or more illustrative aspects of the present invention, there is provided a light emitting device including: a light emitting element that emits ultraviolet light or short-wavelength visible light; a first phosphor that is excited by the ultraviolet light or short-wavelength visible light to emit first visible light; and a second phosphor that is excited by the ultraviolet light or short-wavelength visible light to emit second visible light, wherein the colors of the first visible light and the second visible light complement each other, and white light is obtained by adding and mixing the colors of the first visible light and the second visible light. The first phosphor includes a composition represented by the formula: $(M^2_x, M^3_y, M^4_z)_m M^1 O_3 X_{(2/n)}$, wherein $M^1$ is Si and may also include at least one element selected from the group consisting of Ge, Ti, Zr, and Sn; wherein $M^2$ is Ca and may also include at least one kind of element selected from the group consisting of Mg, Ba, and Zn; wherein $M^3$ is Sr and may also include at least one kind of element selected from the group consisting of Mg, Ba, and Zn, provided that $M^3$ preferably includes Sr; wherein X is at least one kind of halogen element; wherein $M^4$ is $Eu^{2+}$i and may also include at least one element selected from the group consisting of rare-earth elements and Mn, wherein m is in a range of $6/6 \leq m \leq 8/6$; n is in a range of $5 \leq n \leq 7$; and x, y, and z satisfies the expression $x+y+z=1$, where $0<x<1$, $0<y<1$, and $0.01 \leq z \leq 0.3$.

Further, the first phosphor represented by the above formula is efficiently excited in a wavelength range of ultraviolet light or short-wavelength visible light, particularly, in a wavelength range near 400 nm and emits visible light having high emission intensity. Accordingly, this phosphor may be used for the light emitting device.

Furthermore, in terms of a color rendering property of a light emitting device, it may be advantageous that the peak wavelength of the emission spectrum of the first phosphor be formed in the wavelength range of 560 to 590 nm and a half-value width thereof be 100 nm or more. It may be more advantageous that the peak wavelength thereof be 576 nm or less. It may be still more advantageous that the peak wavelength thereof be 574 nm or less.

As long as the second phosphor emits visible light having a color that complements the color of the visible light emitted from the first phosphor, the emission spectrum of the second phosphor is not particularly limited. For example, if the first phosphor emits yellow light, it may be advantageous to use a phosphor for emitting blue light, which is a complementary light color of the yellow light in order to obtain a light emitting device that emits white light. Further, in order to achieve the same object, in terms of a color rendering property, it may be advantageous that the peak wavelength of the emission spectrum of the second phosphor be formed in the wavelength range of 440 to 470 nm and a half-value width thereof be in the range of 30 to 60 nm.

As long as the light emitting element emits at least ultraviolet light or short-wavelength visible light, the emission spectrum of the light emitting element is not particularly limited. However, in terms of light emission efficiency of the light emitting device, it may be advantageous that the peak wavelength of the emission spectrum be in the range of 350 to 430 nm.

Further, as a specific example of the light emitting element, for example, there may be used various light sources including a semiconductor light emitting element such as an LED or an LD, a light source that emits light by vacuum discharge or thermoluminescence, and an electron beam excited light emitting element. More preferably, if a semiconductor light emitting element is used as the light emitting element, it may be possible to obtain a light emitting device that has a small size and long life and saves electric power. A preferred example of the semiconductor light emitting element may include an InGaN-based LED or LD that has good light-emitting characteristics in a wavelength range near 400 nm.

Meanwhile, the arbitrary combination of the above-mentioned components and the expression of the invention changed between a method, a device, a system, and the like are also effective as an aspect of the invention.

According to an exemplary embodiment of the invention, it may be possible to provide a phosphor that emits light of which an emission spectrum has a peak wavelength closer to a wavelength where luminosity becomes maximum.

DETAILED DESCRIPTION OF EXEMPLARY EMBODIMENTS

Figure 1:
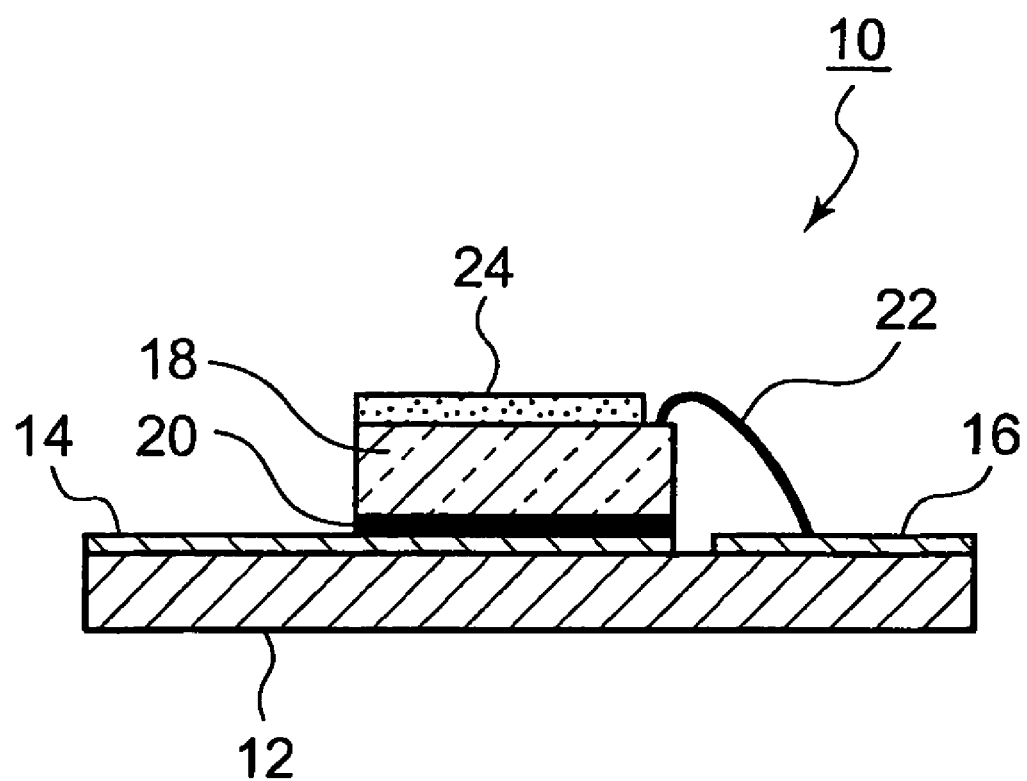
FIG. 1 is a schematic cross-sectional view of a light emitting device according to an exemplary embodiment of the invention.

Exemplary embodiments of the invention will be described in detail below with reference to drawings, but the exemplary embodiments are not limited to the following examples. Further, the same components are denoted by the same reference numerals in the drawings and the duplicate detailed description thereof will be appropriately omitted herein.

FIG. 1 is a schematic cross-sectional view of a light emitting device according to an embodiment. In a light emitting device 10 shown in FIG. 1, a pair of electrodes (positive and negative electrodes) 14 and 16 is formed on a substrate 12. A semiconductor light emitting element 18 is fixed to the electrode 14 by a mounting member 20. The semiconductor light emitting element 18 and the electrode 14 are electrically connected to each other by the mounting member 20, and the semiconductor light emitting element 18 and the electrode 16 are electrically connected to each other by a wire 22. A phosphor layer 24 is formed on the semiconductor light emitting element 18.

The substrate 12 is preferably made of a material, which does not have electric conductivity but has high thermal conductivity. For example, a ceramic substrate (such as an aluminum nitride substrate, an alumina substrate, a mullite substrate, and a glass ceramic substrate), a glass epoxy substrate, and the like may be used as the substrate.

Each of the electrodes 14 and 16 is a conductive layer that is made of a metal material such as gold or copper.

The semiconductor light emitting element 18 is an example of a light emitting element that is used for the light emitting device according to the invention. For example, an LED, an LD, or the like, which emits ultraviolet light or short-wavelength visible light, may be used as the semiconductor light emitting element. Specifically, examples of the semiconductor light emitting element may include an InGaN-based compound semiconductor. An emission wavelength range of the InGaN-based compound semiconductor varies depending on the content of In. The emission wavelength tends to become a long wavelength if the content of In is large, and tends to become a short wavelength if the content of In is small. However, it is confirmed that the quantum efficiency of an InGaN-based compound semiconductor, which contains In so as to have a peak wavelength of about 400 nm has the highest light emission.

For example, the mounting member 20 is gold-tin eutectic solder or a conductive adhesive such as silver paste. The mounting member 20 fixes the lower surface of the semiconductor light emitting element 18 to the electrode 14, and electrically connects the electrode formed on the lower surface of the semiconductor light emitting element 18 with the electrode 14 formed on the substrate 12.

The wire 22 is a conductive member such as a gold wire. For example, the wire is bonded to the electrode 16 and an electrode, which is formed on the upper surface of the semiconductor light emitting element 18, by ultrasonic thermocompression bonding or the like, and connects the electrode 16 with the electrode formed on the upper surface of the semiconductor light emitting element.

Phosphors to be described below are sealed in the phosphor layer 24 in the shape of a film (layer) that covers the upper surface of the semiconductor light emitting element 18 by a binder member. The phosphor layer 24 is formed by preparing phosphor paste where phosphors are mixed in a liquid or gel-like binder member, applying the phosphor paste on the upper surface of the semiconductor light emitting element 18, and then hardening the binder member of the phosphor paste. For example, a silicone resin, a fluorine resin, or the like may be used as the binder member. Further, since the light emitting device according to this embodiment uses ultraviolet light or short-wavelength visible light as an excitation light source, it is advantageous that the binder member excellent in ultraviolet light resistance be used for the light emitting device.

Furthermore, materials having various properties other than phosphors may be mixed in the phosphor layer 24. It may be possible to increase the refractive index of the phosphor layer 24 by mixing a material of which the refractive index is higher than that of the binder member, for example, a metal oxide, a fluorine compound, sulfide in the phosphor layer 24. Accordingly, total reflection, which occurs when light emitted from the semiconductor light emitting element 18 enters the phosphor layer 24, is reduced, so that it may be possible to obtain an advantage of improving the efficiency of excitation light that enters the phosphor layer 24. In addition, if the particle size of the material to be mixed is set to nanosize, it may be possible to increase the refractive index without the decrease of the transparency of the phosphor layer 24. Further, white powder, which has an average particle size of about 0.3 to 3 μm (which is equal to an average particle size of alumina, zirconia, a titanium oxide, or the like), may be mixed in the phosphor layer 24 as a light scattering agent. Accordingly, it may be possible to prevent unevenness in brightness and chromaticity on the light emitting surface.

Each of the phosphors used for the light emitting device according to this embodiment will be described in detail below.

(First Phosphor)

For example, a first phosphor may be obtained as follows: Compounds represented by the following composition formulae (1) to (4) may be used as raw materials of the first phosphor.

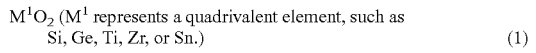

$M^1O_2$ ($M^1$ represents a quadrivalent element, such as Si, Ge, Ti, Zr, or Sn.) (1)

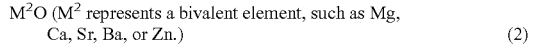

$M^2O$ ($M^2$ represents a bivalent element, such as Mg, Ca, Sr, Ba, or Zn.) (2)

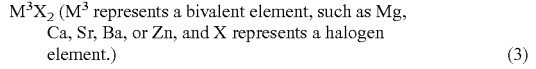

$M^3X_2$ ($M^3$ represents a bivalent element, such as Mg, Ca, Sr, Ba, or Zn, and X represents a halogen element.) (3)

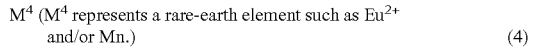

$M^4$ ($M^4$ represents a rare-earth element such as $Eu^{2+}$ and/or Mn.) (4)

For example, $SiO_2$, $GeO_2$, $TiO_2$, $ZrO_2$, $SnO_2$ or the like may be used as a raw material of Composition formula (1). For example, a hydroxide, an oxide, and a carbonate of a bivalent metal ion may be used as a raw material of Composition formula (2). For example, $SrCl_2$, $SrCl_2 \cdot 6H_2O$, $MgCl_2$, $MgCl_2 \cdot 6H_2O$, $CaCl_2$, $CaCl_2 \cdot 2H_2O$, $BaCl_2$, $BaCl_2 \cdot 2H_2O$, $ZnCl_2$, $MgF_2$, $CaF_2$, $SrF_2$, $BaF_2$, $ZnF_2$, $MgBr_2$, $CaBr_2$, $SrBr_2$, $BaBr_2$, $ZnBr_2$, $MgI_2$, $CaI_2$, $SrI_2$, $BaI_2$, $ZnI_2$ or the like may be used as a raw material of Composition formula (3). For example, $Eu_2O_3$, $Eu_2(CO_3)_3$, $Eu(OH)_3$, $EuCl_3$, MnO, $Mn(OH)_2$, $MnCO_3$, $MnCl_2 \cdot 4H_2O$, $Mn(NO_3)_2 \cdot 6H_2O$, or the like may be used as a raw material of Composition formula (4).

It may be advantageous that the raw material of Composition formula (1) be a compound where $M^1$ is Si and may further include at least one kind of element selected from a group consisting of Ge, Ti, Zr, and Sn and the ratio of Si is 80 mol % or more. It may be advantageous that the raw material of Composition formula (2) be a compound where $M^2$ is at least one kind of element necessarily including at least Ca and/or Sr and may include at least one element selected from a group consisting of Mg, Ca, Sr, Ba, and Zn and a ratio of Ca and/or Sr is 60 mol % or more. It may be advantageous that the raw material of Composition formula (3) be a compound where $M^3$ is Sr and may include at least one kind of element selected from a group consisting of Mg, Ca, Ba, and Zn and a ratio of Sr is 30 mol % or more. Further, it may be advantageous that the raw material of Composition formula (3) be a compound where X is at least one kind of halogen element necessarily including at least Cl and a ratio of Cl is 50 mol % or more. It may be advantageous that the raw material of Composition formula (4) be $M^4$ that is a rare-earth element necessarily including bivalent Eu, and the raw material of Composition formula (4) may also include rare-earth elements except for Mn or Eu.

The raw materials of Composition formulae (1) to (4) are weighed at molar ratios that satisfy "(1):(2)=1:0.1 to 1.0, (2):(3)=1:0.2 to 12.0, and (2):(4)=1:0.05 to 4.0", preferably, "(1):(2)=1:0.25 to 1.0, (2):(3)=1:0.3 to 6.0, and (2):(4)=1:0.05 to 3.0", more preferably, "(1):(2)=1:0.25 to 1.0, (2):(3)=1:0.3 to 4.0, and (2):(4)=1:0.05 to 3.0". The respective weighed raw materials are put in an alumina mortar and are pulverized and mixed for about 30 minutes, so that a raw material mixture is obtained. The raw material mixture is put in an alumina crucible, and is fired for 3 to 40 hours under a predetermined atmosphere ($H_2:N_2=5:95$) at a temperature of 700° C. to 1100° C. by an electric furnace corresponding to a reducing atmosphere. As a result, a fired material is obtained. It may be possible to obtain a first phosphor by deliberately washing the fired material with warm pure water so that surplus chloride is washed out. The first phosphor is excited by ultraviolet light or short-wavelength visible light and emits visible light.

Meanwhile, it may be advantageous that an excessive amount of the raw material (bivalent metal halide) of Composition formula (3) exceeding a stoichiometric ratio be weighed. This is to consider that a part of a halogen element is gasified and vaporized during the firing, and the reason for this is to prevent the generation of crystal defects of the phosphor that is caused by the lack of a halogen element. Further, the excessively added raw material of Composition formula (3) is liquefied at a firing temperature, functions as a flux for a solid-phase reaction, facilitates a solid-phase reaction, and improves crystallinity.

Meanwhile, after the above-mentioned raw material mixture is fired, the excessively added raw material of Composition formula (3), which has been mentioned above, exists in the manufactured phosphor as impurities. In order to obtain a phosphor that has high purity and high emission intensity, these impurities need to be washed out with warm pure water. A composition ratio shown in the formula of the first phosphor of this embodiment is a composition ratio after the impurities are washed out, and the raw material of Composition formula (3), which is excessively added and becomes impurities, is not added in terms of this composition ratio.

In this embodiment, it may be advantageous that metal elements becoming impurities are reduced as much as possible in order to obtain a phosphor having high light emission efficiency. In particular, transition metal elements such as Fe, Co, and Ni, function as an emission inhibitor. For this reason, it may be advantageous to use raw materials having high purity and prevent the mixing of impurities in a synthesis process so that the sum of the amount of these elements is 500 ppm or less.

(Second Phosphor)

For example, a second phosphor may be obtained as follows: $CaCO_3$, $MgCO_3$, $CaCl_2$, $CaHPO_4$, and $Eu_2O_3$ are used as raw materials of the second phosphor. These raw material are weighed at predetermined ratios so that molar ratios satisfy "$CaCO_3:MgCO_3:CaCl_2:CaHPO_4:Eu_2O_3$=0.05 to 0.35: 0.01 to 0.50:0.17 to 0.50:1.00:0.005 to 0.050". The respective weighed raw materials are put in an alumina mortar and are pulverized and mixed for about 30 minutes, so that a raw material mixture is obtained. The raw material mixture is put in an alumina crucible, and then is fired for 3 hours under a $N_2$ atmosphere including 2 to 5% of $H_2$ at a temperature of 800° C. to 1200° C. As a result, a fired material is obtained. It may be possible to obtain a second phosphor by deliberately washing the fired material with warm pure water so that surplus chloride is washed out. The second phosphor emits visible light of a color which compliments the color of the visible light emitted from the first phosphor.

Meanwhile, as for the weighing (molar ratio) of $CaCl_2$ when the above-mentioned raw material mixture is obtained, it may be advantageous to weigh an excessive amount of $CaCl_2$, which exceeds a stoichiometric ratio thereof by 0.5 mol or more in terms of the composition ratio of the second phosphor to be manufactured. Accordingly, it may be possible to prevent the generation of crystal defects of the second phosphor that is caused by the lack of Cl.

<Specifying of Crystal Structure of Phosphor>

The selection of the crystal structure or the like of the phosphor according to this embodiment will be described below. A certain material will be described below as an example, but the crystal structure or the like of each phosphor to be described below may also be selected by a similar method.

First, the single crystal of a host crystal to be described below was grown. This host crystal is a material where $M^1$ is Si, $M^2$ is Ca and Sr, $M^3$ is Sr, and X is Cl in a formula of $M^1O_2 \cdot aM^2O \cdot bM^3X_2:M^4$ and $M^4$ is not included.

<Analysis and Formation of Host Crystal>

The crystal growth of the single crystal of the host crystal was performed in the following procedure. First, the respective raw materials of $SiO_2$, CaO, and $SrCl_2$, were weighed so that the molar ratios thereof satisfied "$SiO_2: CaO:SrCl_2$=1: 0.71:1.07". The respective weighed raw materials were put in an alumina mortar and were pulverized and mixed for about 30 minutes, so that a raw material mixture was obtained. This raw material mixture was put in a tablet mold and the uniaxial compression molding was performed at 100 MPa, so that a molded body was obtained. After this molded body was put in an alumina crucible and the alumina crucible was covered with a lid, the molded body was fired for 36 hours at a temperature of 1030° C. As a result, a fired material was obtained. A host crystal was obtained by washing the obtained fired material with warm pure water and ultrasonic waves. A single crystal having a diameter of φ0.2 mm was obtained in the host crystal that was formed as described above.

Element quantitative analysis was performed for the obtained host crystal by the following method, so that a composition ratio (values a and b of the formula) was determined.

(1) Quantitative Analysis of Si

The host crystal was melted in a platinum crucible by sodium carbonate, was dissolved in diluted nitric acid, and was then made to have a constant volume. The amount of Si in the solution was measured by an ICP emission spectrophotometer (trade name: SPS-4000, manufactured by SII Nano-Technology Inc.).

(2) Quantitative Analysis of Metal Element

The host crystal was heated and decomposed under inert gas by using perchloric acid, nitric acid, and hydrofluoric acid, was dissolved in diluted nitric acid, and was then made to have constant volume. The amount of metal elements in the solution was measured by the above-mentioned ICP emission spectrophotometer.

(3) Quantitative Analysis of Cl

The host crystal was burned in a tubular electric furnace, and generated gas was adsorbed in adsorption liquid. The amount of Cl in the solution was determined using an ion chromatography method by DX-500 manufactured by Dionex Corporation.

(4) Quantitative Analysis of O

A sample of the host crystal was thermally decomposed in argon by an oxygen-nitrogen analyzer TC-436 manufactured by LECO Corporation, and the amount of generated oxygen was determined by an infrared absorption method.

As the results of the above-mentioned element quantitative analysis, the approximate composition ratio of the obtained host crystal is shown by Formula (1).

$$SiO_2 \cdot 1.05(Ca_{0.6},Sr_{0.4})O \cdot 0.15SrCl_2 \qquad (1)$$

Further, the specific gravity of the above-mentioned host crystal measured by a pycnometer was 3.4.

For the single crystal of the host crystal, an X-ray diffraction pattern using a Kα ray of Mo (wavelength λ=0.71 Å) was measured by an imaging plate automatic X-ray single crystal structure analysis system (trade name: R-AXIS RAPID, manufactured by RIGAKU Corporation) (hereinafter, referred to as Measurement 1).

The following crystal structure analysis was performed using 5709 diffraction spots that were obtained in the range satisfying "2θ<60° (d>0.71 Å)" by Measurement 1.

Crystal system, Bravais lattices, a space group, and a lattice constant of the host crystal were determined from the X-ray diffraction pattern measured by Measurement 1 by using data processing software (trade name: Rapid Auto, manufactured by RIGAKU Corporation) as follows:

Crystal system: monoclinic crystal
Bravais lattices: base-centered monoclinic lattices
Space group: C2/m
Lattice constant:
a=13.3036(12) Å
b=8.3067(8) Å
c=9.1567(12) Å
α=γ=90°
β=110.226(5)°
V=949.50(18) Å³

After that, rough structure was determined using crystal structure analysis software (trade name: Crystal Structure, manufactured by RIGAKU Corporation) by a direct method, and then structure parameters (site occupancy, atomic coordinates, a temperature factor, and the like) were refined by a least square method. Refinement was performed for |F| of independent 1160 spots satisfying "|F|>2σ$_F$". As a result, a crystal structure model having a reliability factor R$_1$ of 2.7% was obtained. Hereinafter, this crystal structure model is referred to as an "initial structure model".

Atomic coordinates and site occupancy of the initial structure model, which was obtained from a single crystal, are shown in Table 1.

TABLE 1

| ELE-MENT | SITE | X | Y | z | OCCU-PANCY |
|---|---|---|---|---|---|
| Ca1 | 2c | 0.0000 | 0.0000 | 0.5000 | 1 |
| Sr2 | 4i | 0.28471(5) | 0.5000 | 0.07924(6) | 1 |
| Sr3 | 8j | 0.09438(5) | 0.74970(8) | 0.24771(6) | 0.427(5) |
| Ca3 | 8j | 0.09438(5) | 0.74970(8) | 0.24771(6) | 0.573(5) |
| Cl1 | 2b | 0.0000 | 0.5000 | 0.0000 | 1 |
| Cl2 | 2a | 0.0000 | 0.0000 | 0.0000 | 1 |
| Si1 | 4i | 0.2323(1) | 0.5000 | 0.4989(2) | 1 |
| Si2 | 8j | −0.15109(9) | 0.6746(1) | 0.2854(1) | 1 |
| O1 | 4i | −0.0985(3) | 0.5000 | 0.2645(5) | 1 |
| O2 | 4i | 0.1987(3) | 0.5000 | 0.3145(4) | 1 |
| O3 | 4i | 0.3575(3) | 0.5000 | 0.6019(5) | 1 |
| O4 | 8j | 0.1734(2) | 0.3423(3) | 0.5469(3) | 1 |
| O5 | 8j | −0.2635(2) | 0.7007(3) | 0.1478(3) | 1 |
| O6 | 8j | −0.0677(2) | 0.8154(4) | 0.2941(3) | 1 |

The composition ratio of the initial structure model obtained from the single crystal was calculated as the following formula (2).

$$SiO_2 \cdot 1.0(Ca_{0.6},Sr_{0.4})O \cdot 0.17SrCl_2 \quad (2)$$

A (bivalent) metal ion, a quadrivalent oxide ion, and a halogen ion of the formula of the above-mentioned phosphor are sorted and designated as a new formula of $(M^2_x, M^3_y, M^4_z)_m M^1 O_3 X_{2/n}$, so that the following formula (3) is obtained.

$$(Ca_{0.51},Sr_{0.49})_{7/6}SiO_3Cl_{2/6} \quad (3)$$

As the result of the analysis, it was found that the above-mentioned host crystal was a crystal having new structure not registered in ICDD (International Center for Diffraction Date) that was an X-ray diffraction database widely used for X-ray diffraction. This analysis method was applied to the respective phosphors to be described below.

The above-mentioned phosphors and the light emitting device will be described in more detail below with reference to examples. However, the description of raw materials of the light emitting device or the phosphors, a method of manufacturing the light emitting device or the phosphors, the chemical composition of the phosphor does not limit the phosphors or the light emitting device according to the embodiment of the invention at all.

First, phosphors, which are used for a light emitting device according to an example, will be described in detail.

Phosphor 1

Phosphor 1 is represented by $(Ca_{0.43}, Sr_{0.51}, Eu_{0.06})_{7/6}SiO_3Cl_{2/6}$. Phosphor 1 is made such that $M^1$ is Si, $M^2$ is Ca, $M^3$ is Sr, X is Cl, $M^4$ is $Eu^{2+}$, m is 7/6, n is 6, and the respective contents x, y, and z of $M^2$, $M^3$, and $M^4$ are 0.43, 0.51, and 0.06 in the above-mentioned formula of $(M^2_x, M^3_y, M^4_z)_m M^1 O_3 X_{2/n}$. Meanwhile, a value x/(y+z), which represents a ratio of an ionic radius of a bivalent metal ion of Phosphor 1, is 0.754. Further, $SiO_2$ is excessively added to Phosphor 1 in terms of the mixing ratios of raw materials, so that cristobalite is formed in the phosphor. In the manufacture of Phosphor 1, first, the respective raw materials of $SiO_2$, $Ca(OH)_2$, $SrCO_3$, $SrCl_2 \cdot 6H_2O$, and $Eu_2O_3$ were weighed so that the molar ratios thereof satisfied the expression "$SiO_2$:$Ca(OH)_2$:$SrCO_3$:$SrCl_2 \cdot 6H_2O$:$Eu_2O_3$=1.1:0.42:0.03:1.0:0.13". The respective weighed raw materials were put in an alumina mortar and were pulverized and mixed for about 30 minutes, so that a raw material mixture was obtained. The raw material mixture was put in an alumina crucible, and was fired for 5 to 40 hours under a predetermined atmosphere ($H_2$:$N_2$=5:95) at a temperature of 1000° C. by an electric furnace corresponding to a reducing atmosphere. As a result, a fired material was obtained. Phosphor 1 was obtained by deliberately washing the obtained fired material with warm pure water.

Phosphor 2

Phosphor 2 is represented by $(Ca_{0.40}, Sr_{0.53}, Eu_{0.07})_{7/6}SiO_3Cl_{2/6}$. Phosphor 2 is made such that $M^1$ is Si, $M^2$ is Ca, $M^3$ is Sr, X is Cl, $M^4$ is $Eu^{2+}$, m is 7/6, n is 6, and the respective contents x, y, and z of $M^2$, $M^3$, and $M^4$ are 0.40, 0.53, and 0.07 in the formula of $(M^2_x, M^3_y, M^4_z)_m M^1 O_3 X_{2/n}$. Meanwhile, a value x/(y+z), which represents a ratio of an ionic radius of a bivalent metal ion of Phosphor 2, is 0.667. Further, $SiO_2$ is excessively added to Phosphor 2 in terms of the mixing ratios of raw materials, so that cristobalite is formed in the phosphor. In the manufacture of Phosphor 2, first, the respective raw materials of $SiO_2$, $Ca(OH)_2$, $SrCO_3$, $SrCl_2 \cdot 6H_2O$, and $Eu_2O_3$ were weighed so that the molar ratios thereof satisfied the expression "$SiO_2$:$Ca(OH)_2$:$SrCO_3$:$SrCl_2 \cdot 6H_2O$:$Eu_2O_3$=1.1:0.39:0.06:1.0:0.13". Then, Phosphor 2 was obtained by the same method as the method of Phosphor 1.

Phosphor 3

Phosphor 3 is represented by $(Ca_{0.38}, Sr_{0.56}, Eu_{0.06})_{7/6}SiO_3Cl_{2/6}$. Phosphor 3 is made such that $M^1$ is Si, $M^2$ is Ca, $M^3$ is Sr, X is Cl, $M^4$ is $Eu^{2+}$, m is 7/6, n is 6, and the respective contents x, y, and z of $M^2$, $M^3$, and $M^4$ are 0.38, 0.56, and 0.06 in the formula of $(M^2_x, M^3_y, M^4_z)_m M^1 O_3 X_{2/n}$. Meanwhile, a value x/(y+z), which represents a ratio of an ionic radius of a bivalent metal ion of Phosphor 3, is 0.613. Further, $SiO_2$ is excessively added to Phosphor 3 in terms of the mixing ratios of raw materials, so that cristobalite is formed in the phosphor. In the manufacture of Phosphor 3, first, the respective raw materials of $SiO_2$, $Ca(OH)_2$, $SrCO_3$, $SrCl_2 \cdot 6H_2O$, and $Eu_2O_3$ were weighed so that the molar ratios thereof satisfied the expression "$SiO_2$:$Ca(OH)_2$:$SrCO_3$:$SrCl_2 \cdot 6H_2O$:$Eu_2O_3$=1.1:0.32:0.13:1.0:0.13". Then, Phosphor 3 was obtained by the same method as the method of Phosphor 1.

Phosphor 4

Phosphor 4 is represented by $(Ca_{0.35}, Sr_{0.58}, Eu_{0.07})_{7/6}SiO_3Cl_{2/6}$. Phosphor 4 is made such that $M^1$ is Si, $M^2$ is Ca, $M^3$ is Sr, X is Cl, $M^4$ is $Eu^{2+}$, m is 7/6, n is 6, and the respective contents x, y, and z of $M^2$, $M^3$, and $M^4$ are 0.35, 0.58, and 0.07 in the formula of $(M^2_x, M^3_y, M^4_z)_m M^1 O_3 X_{2/n}$. Meanwhile, a value x/(y+z), which represents a ratio of an ionic radius of a bivalent metal ion of Phosphor 4, is 0.538. Further, $SiO_2$ is excessively added to Phosphor 4 in terms of the mixing ratios of raw materials, so that cristobalite is formed in the phosphor. In the manufacture of Phosphor 4, first, the respective raw materials of $SiO_2$, $Ca(OH)_2$, $SrCO_3$, $SrCl_2.6H_2O$, and $Eu_2O_3$ were weighed so that the molar ratios thereof satisfied the expression "$SiO_2:Ca(OH)_2:SrCO_3:SrCl_2.6H_2O:Eu_2O_3=1.1:0.29:0.16:1.0:0.13$". Then, Phosphor 4 was obtained by the same method as the method of Phosphor 1.

Phosphor 5

Phosphor 5 is represented by $(Ca_{0.53}, Sr_{0.37}, Eu_{0.10})_{7/6}SiO_3(Cl_{0.86}, Br_{0.14})_{2/6}$. Phosphor 5 is made such that $M^1$ is Si, $M^2$ is Ca, $M^3$ is Sr, X is Cl and Br, $M^4$ is $Eu^{2+}$, m is 7/6, n is 6, and the respective contents x, y, and z of $M^2$, $M^3$, and $M^4$ are 0.53, 0.37, and 0.10 in the formula of $(M^2_x, M^3_y, M^4_z)_m M^1 O_3 X_{2/n}$. The molar ratio $X_{Br}$ of Br in composition halogen is 0.14. Further, $SiO_2$ is excessively added to Phosphor 5 in terms of the mixing ratios of raw materials, so that cristobalite is formed in the phosphor. In the manufacture of Phosphor 5, first, the respective raw materials of $SiO_2$, $Ca(OH)_2$, $SrBr_2$, $SrCl_2.6H_2O$, and $Eu_2O_3$ were weighed so that the molar ratios thereof satisfied the expression "$SiO_2:Ca(OH)_2:SrBr_2:SrCl_2.6H_2O:Eu_2O_3=1.1:0.45:0.26:0.78:0.13$". Then, Phosphor 5 was obtained by the same method as the method of Phosphor 1.

Phosphor 6

Phosphor 6 is represented by $(Ca_{0.46}, Sr_{0.49}, Eu_{0.05})_{7/6}SiO_3(Cl_{0.77}, Br_{0.23})_{2/6}$. Phosphor 6 is made such that $M^1$ is Si, $M^2$ is Ca, $M^3$ is Sr, X is Cl and Br, $M^4$ is $Eu^{2+}$, m is 7/6, n is 6, and the respective contents x, y, and z of $M^2$, $M^3$, and $M^4$ are 0.46, 0.49, and 0.05 in the formula of $(M^2_x, M^3_y, M^4_z)_m M^1 O_3 X_{2/n}$. The molar ratio $X_{Br}$ of Br in composition halogen is 0.23. Further, $SiO_2$ is excessively added to Phosphor 6 in terms of the mixing ratios of raw materials, so that cristobalite is formed in the phosphor. In the manufacture of Phosphor 6, first, the respective raw materials of $SiO_2$, $Ca(OH)_2$, $SrBr_2$, $SrCl_2.6H_2O$, and $Eu_2O_3$ were weighed so that the molar ratios thereof satisfied the expression "$SiO_2:Ca(OH)_2:SrBr_2:SrCl_2.6H_2O:Eu_2O_3=1.1:0.45:0.39:0.65:0.13$". Then, Phosphor 6 was obtained by the same method as the method of Phosphor 1.

Phosphor 7

Phosphor 7 is represented by $(Ca_{0.51}, Sr_{0.44}, Eu_{0.05})_{7/6}SiO_3(Cl_{0.72}, Br_{0.28})_{2/6}$. Phosphor 7 is made such that $M^1$ is Si, $M^2$ is Ca, $M^3$ is Sr, X is Cl and Br, $M^4$ is $Eu^{2+}$, m is 7/6, n is 6, and the respective contents x, y, and z of $M^2$, $M^3$, and $M^4$ are 0.51, 0.44, and 0.05 in the formula of $(M^2_x, M^3_y, M^4_z)_m M^1 O_3 X_{2/n}$. The molar ratio $X_{Br}$ of Br in composition halogen is 0.28. Further, $SiO_2$ is excessively added to Phosphor 7 in terms of the mixing ratios of raw materials, so that cristobalite is formed in the phosphor. In the manufacture of Phosphor 7, first, the respective raw materials of $SiO_2$, $Ca(OH)_2$, $SrBr_2$, $SrCl_2.6H_2O$, and $Eu_2O_3$ were weighed so that the molar ratios thereof satisfied the expression "$SiO_2:Ca(OH)_2:SrBr_2:SrCl_2.6H_2O:Eu_2O_3=1.1:0.45:0.65:0.65:0.13$". Then, Phosphor 7 was obtained by the same method as the method of Phosphor 1.

Phosphor 8

Phosphor 8 is represented by $(Ca_{0.47}, Sr_{0.48}, Eu_{0.05})_{7/6}SiO_3Cl_{2/6}$. Phosphor 8 is synthesized so that $M^1$ is Si, $M^2$ is Ca, $M^3$ is Sr, X is Cl, $M^4$ is $Eu^{2+}$, m is 7/6, n is 6, and the respective contents x, y, and z of $M^2$, $M^3$, and $M^4$ are 0.47, 0.48, and 0.05 in the formula of $(M^2_x, M^3_y, M^4_z)_m M^1 O_3 X_{2/n}$. Meanwhile, a value x/(y+z), which represents a ratio of an ionic radius of a bivalent metal ion of Phosphor 8, is 0.887. Further, $SiO_2$ is excessively added to Phosphor 8 in terms of the mixing ratios of raw materials, so that cristobalite is formed in the phosphor. In the manufacture of Phosphor 8, first, the respective raw materials of $SiO_2$, $Ca(OH)_2$, $SrCl_2.6H_2O$, and $Eu_2O_3$ were weighed so that the molar ratios thereof satisfied the expression "$SiO_2:Ca(OH)_2:SrCl_2.6H_2O:Eu_2O_3=1.1:0.45:1.0:0.13$". Then, Phosphor 8 was obtained by the same method as the method of Phosphor 1.

Comparative Examples

Phosphor 9

Phosphor 9 is represented by $(Ca_{0.32}, Sr_{0.59}, Eu_{0.09})_{7/6}SiO_3Cl_{2/6}$. Phosphor 9 is made such that $M^1$ is Si, $M^2$ is Ca, $M^3$ is Sr, X is Cl, $M^4$ is $Eu^{2+}$, m is 7/6, n is 6, and the respective contents x, y, and z of $M^2$, $M^3$, and $M^4$ are 0.32, 0.59, and 0.09 in the formula of $(M^2_x, M^3_y, M^4_z)_m M^1 O_3 X_{2/n}$. Meanwhile, a value x/(y+z), which represents a ratio of an ionic radius of a bivalent metal ion of Phosphor 9, is 0.470. Further, $SiO_2$ is excessively added to Phosphor 9 in terms of the mixing ratios of raw materials, so that cristobalite is formed in the phosphor. In the manufacture of Phosphor 9, first, the respective raw materials of $SiO_2$, $Ca(OH)_2$, $SrCO_3$, $SrCl_2.6H_2O$, and $Eu_2O_3$ were weighed so that the molar ratios thereof satisfied the expression "$SiO_2:Ca(OH)_2:SrCO_3:SrCl_2.6H_2O:Eu_2O_3=1.1:0.23:0.23:1.0:0.13$". Then, Phosphor 9 was obtained by the same method as the method of Phosphor 1.

Phosphor 10

Phosphor 10 is represented by $(Ca_{0.50}, Sr_{0.45}, Eu_{0.05})_{7/6}SiO_3(Cl_{0.67}, Br_{0.33})_{2/6}$. Phosphor 10 is made such that $M^1$ is Si, $M^2$ is Ca, $M^3$ is Sr, X is Cl and Br, $M^4$ is $Eu^{2+}$, m is 7/6, n is 6, and the respective contents x, y, and z of $M^2$, $M^3$, and $M^4$ are 0.50, 0.45, and 0.05 in the formula of $(M^2_x, M^3_y, M^4_z)_m M^1 O_3 X_{2/n}$. The molar ratio $X_{Br}$ of Br in composition halogen is 0.33. Further, $SiO_2$ is excessively added to Phosphor 10 in terms of the mixing ratios of raw materials, so that cristobalite is formed in the phosphor. In the manufacture of Phosphor 10, first, the respective raw materials of $SiO_2$, $Ca(OH)_2$, $SrBr_2$, $SrCl_2.6H_2O$, and $Eu_2O_3$ were weighed so that the molar ratios thereof satisfied the expression "$SiO_2:Ca(OH)_2:SrBr_2:SrCl_2.6H_2O:Eu_2O_3=1.1:0.45:0.71:0.65:0.13$". Then, Phosphor 10 was obtained by the same method as the method of Phosphor 1.

Figure 2:
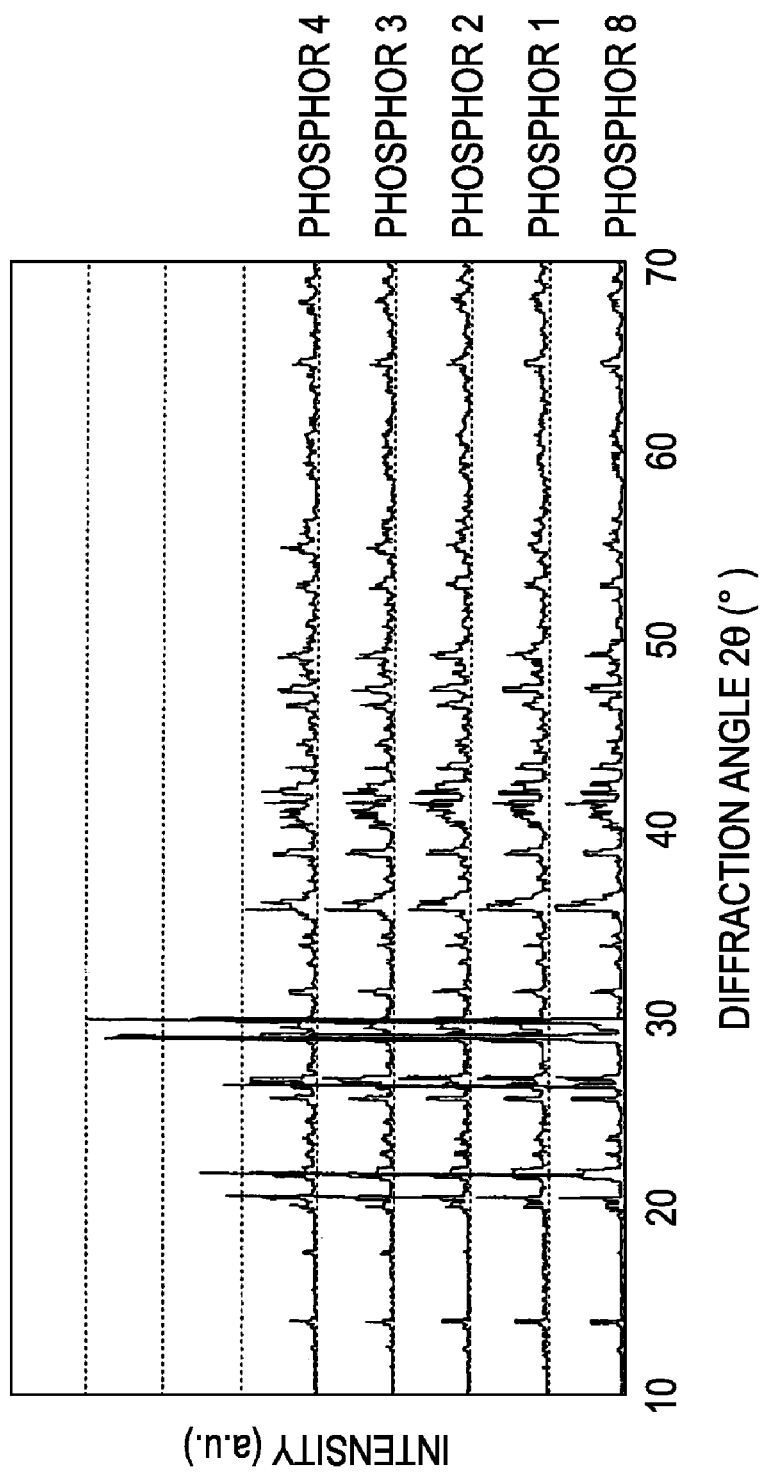
FIG. 2 is a view showing measurement results of X-ray diffraction of Phosphors 1 to 4 and 8 according to examples using a Kα characteristic X-ray of Cu.
Figure 3:
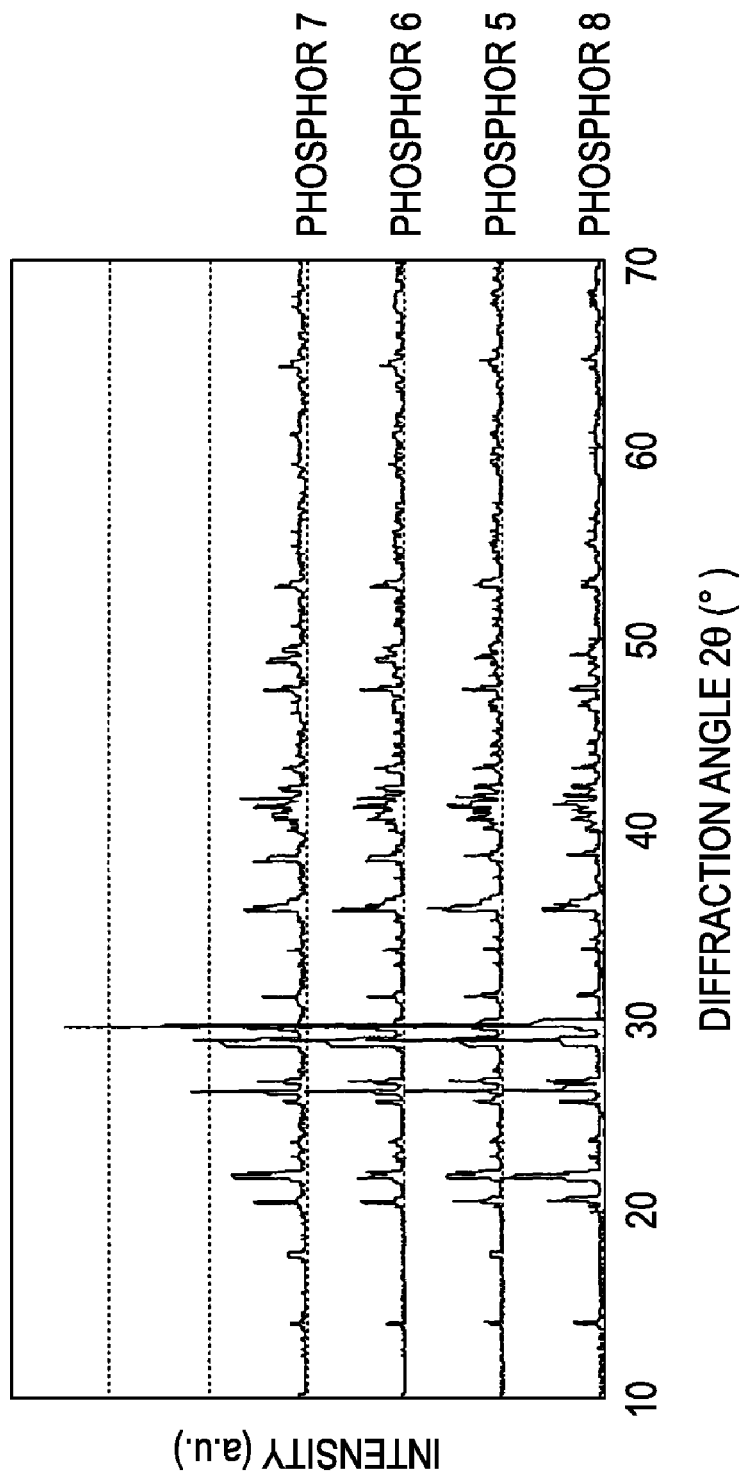
FIG. 3 is a view showing measurement results of X-ray diffraction of Phosphors 5 to 8 according to examples using a Kα characteristic X-ray of Cu.

After that, the X-ray diffraction of the crystal of each of the above-mentioned phosphors was measured. First, powder X-ray diffraction was measured using a Kα characteristic X-ray of Cu by a powder X-ray diffractometer (trade name: RINT UltimaIII, manufactured by RIGAKU Corporation) (hereinafter, referred to as Measurement 2). Diffraction patterns observed in Measurement 2 are shown in FIGS. 2 and 3. FIG. 2 is a view showing measurement results of X-ray diffraction, using a Kα characteristic X-ray of Cu, of Phosphors 1 to 4 and 8 according to examples. FIG. 3 is a view showing measurement results of X-ray diffraction, using a Kα characteristic X-ray of Cu, of Phosphors 5 to 8 according to examples. As shown in FIGS. 2 and 3, the X-ray diffraction patterns of Phosphors 1 to 8 correspond to one another very well. Accordingly, it is found that the phosphors have the same crystal structure.

Figure 4:
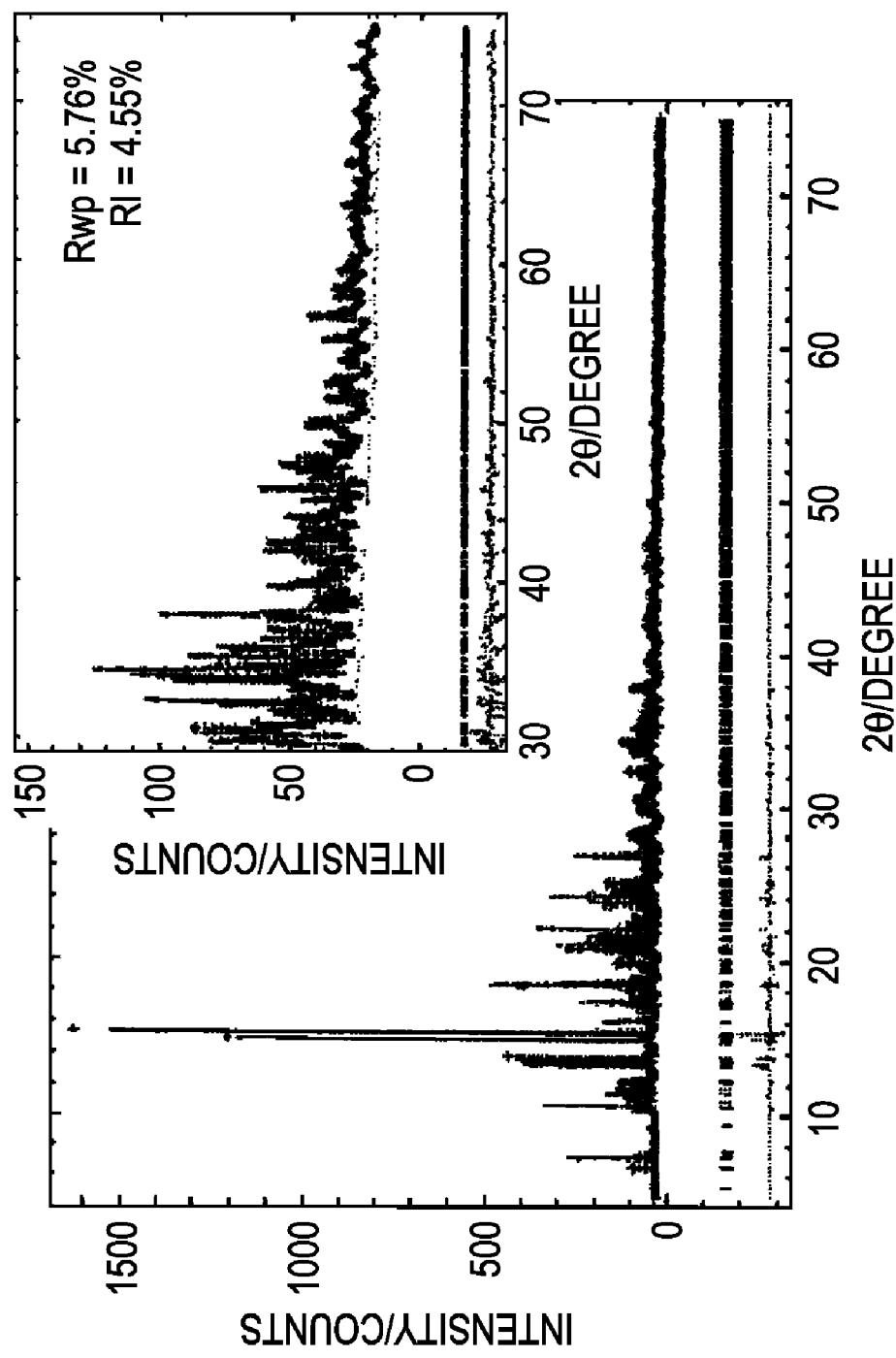
FIG. 4 is a view showing the result of Rietveld analysis of Phosphor 1 according to an example.

In order to obtain more detailed crystal structure, the X-ray diffraction of a powdery phosphor sample as a powder host crystal was precisely measured using an X-ray, which has a wavelength of 0.8022 Å, by a BL02B2 large Debye-Scherrer camera of "Super Photon ring-8 GeV (Spring-8)" of Japan Synchrotron Radiation Research Center (hereinafter, referred to as Measurement 3). Rietveld analysis of the diffraction patterns observed in Measurement 3 was performed, so that phosphor composition and lattice constants were specified. When Rietveld analysis was performed, refinement was performed using the lattice constant, the atomic coordinates, and a space group of the above-mentioned initial structure model as a model. FIG. 4 is a view showing the result of Rietveld analysis of Phosphor 1 according to the example. As a result, diffraction patterns observed in Measurement 3 and calculated diffraction patterns fitted by Rietveld analysis correspond to each other very well. Accordingly, an R factor, which was used to determine the degree of correspondence, indicated a very small value ($R_{wp}$=5.76%).

The composition ratios of Phosphors 1 to 10 calculated by Rietveld analysis are shown in Table 2. Meanwhile, since Phosphor 9 contained many impurities and did not converge in Rietveld analysis, analysis values of an electron probe X-ray micro-analyzer (EPMA) are indicated.

TABLE 2

| | M1 | M2 | M3 | M4 | X | | m | n |
|---|---|---|---|---|---|---|---|---|
| | Si | Ca | Sr | $Eu^{2+}$ | Cl | Br | | |
| PHOSPHOR 1 | 1 | 0.43 | 0.51 | 0.06 | 1 | 0 | 7/6 | 6 |
| PHOSPHOR 2 | 1 | 0.4 | 0.53 | 0.07 | 1 | 0 | 7/6 | 6 |
| PHOSPHOR 3 | 1 | 0.38 | 0.56 | 0.06 | 1 | 0 | 7/6 | 6 |
| PHOSPHOR 4 | 1 | 0.35 | 0.58 | 0.07 | 1 | 0 | 7/6 | 6 |
| PHOSPHOR 5 | 1 | 0.53 | 0.37 | 0.1 | 0.86 | 0.14 | 7/6 | 6 |
| PHOSPHOR 6 | 1 | 0.46 | 0.49 | 0.05 | 0.77 | 0.23 | 7/6 | 6 |
| PHOSPHOR 7 | 1 | 0.51 | 0.44 | 0.05 | 0.72 | 0.28 | 7/6 | 6 |
| PHOSPHOR 8 | 1 | 0.47 | 0.48 | 0.05 | 1 | 0 | 7/6 | 6 |
| PHOSPHOR 9 | 1 | 0.32 | 0.59 | 0.09 | 1 | 0 | 7/6 | 6 |
| PHOSPHOR 10 | 1 | 0.5 | 0.45 | 0.05 | 0.67 | 0.33 | 7/6 | 6 |

Subsequently, the lattice constants of Phosphors 1 to 10 calculated by Rietveld analysis are shown in Table 3.

TABLE 3

| | a | b | c | α | β | γ |
|---|---|---|---|---|---|---|
| PHOSPHOR 1 | 13.34 | 8.36 | 9.18 | 90 | 110.190 | 90 |
| PHOSPHOR 2 | 13.36 | 8.36 | 9.19 | 90 | 110.19 | 90 |
| PHOSPHOR 3 | 13.39 | 8.37 | 9.1930 | 90 | 110.18 | 90 |
| PHOSPHOR 4 | 13.4070 | 8.38 | 9.2 | 90 | 110.19 | 90 |
| PHOSPHOR 5 | 13.3 | 8.35 | 9.18 | 90 | 110.05 | 90 |
| PHOSPHOR 6 | 13.31 | 8.35 | 9.2 | 90 | 109.97 | 90 |
| PHOSPHOR 7 | 13.31 | 8.3550 | 9.2 | 90 | 109.93 | 90 |
| PHOSPHOR 8 | 13.34 | 8.36 | 9.19 | 90 | 110.2 | 90 |
| PHOSPHOR 9 | THERE ARE MANY IMPURITIES AND DO NOT CONVERGE | | | | | |
| PHOSPHOR 10 | 13.3 | 8.35 | 9.2 | 90 | 109.89 | 90 |

After that, the emission dominant wavelengths and luminous flux ratios of Phosphors 1 to 10 are shown in Table 4. Meanwhile, a luminous flux ratio indicates a ratio assuming that luminous flux measured, when Phosphor 8 is irradiated with excitation light having a wavelength of 400 nm, is 100. Further, as for Phosphor 9, analysis values calculated by EPMA analysis are indicated.

TABLE 4

| | x/(y + z) | $X_{Br}$ | EMISSION DOMINANT WAVELENGTH (nm) | LUMINOUS FLUX RATIO |
|---|---|---|---|---|
| PHOSPHOR 1 | 0.75 | 0 | 575.6 | 103.2 |
| PHOSPHOR 2 | 0.67 | 0 | 575.3 | 105.1 |
| PHOSPHOR 3 | 0.61 | 0 | 573.6 | 103.3 |
| PHOSPHOR 4 | 0.54 | 0 | 573.6 | 100.8 |
| PHOSPHOR 5 | 1.13 | 0.14 | 574.7 | 100.9 |
| PHOSPHOR 6 | 0.85 | 0.23 | 573.2 | 105.4 |
| PHOSPHOR 7 | 1.04 | 0.28 | 572.1 | 100.5 |
| PHOSPHOR 8 | 0.89 | 0 | 576.0 | 100.0 |
| PHOSPHOR 9 | 0.470 | 0 | 573.7 | 60.0 |
| PHOSPHOR 10 | 1.000 | 0.33 | 571.1 | 82.5 |

Figure 5:
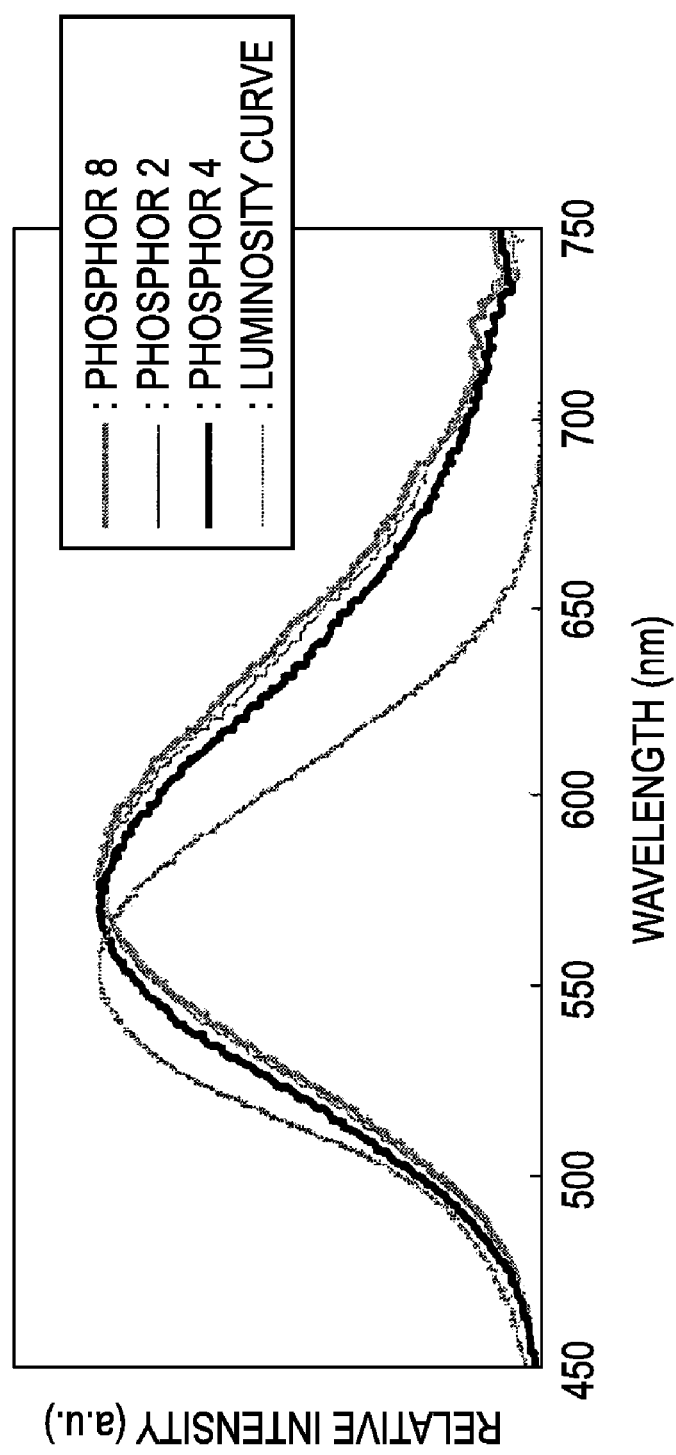
FIG. 5 is a view showing a luminosity curve and emission spectra of Phosphors 2, 4, and 8.

As described above, Phosphors 1 to 4, 8, 9 are samples where $M^1$ is Si, $M^2$ is Ca, $M^3$ is Sr, X is Cl, and $M^4$ is $Eu^{2+}$ in the formula $(M^2_x, M^3_y, M^4_z)_m M^1 O_3 X_{2/n}$. In these samples, the ratios of bivalent metal elements Ca and Sr (and $Eu^{2+}$) having different radii of contained ions are different from each other. In this case, as shown in Table 4, it is found that the peak wavelength of the emission spectrum is shifted toward the short wavelength as a value of the molar ratio x/(y+z), which represents the ratio of Ca having a small ionic radius, is decreased. FIG. 5 is a view showing a luminosity curve and emission spectra of Phosphors 2, 4, and 8.

However, it is found that emission intensity is low and a fluorescence property deteriorates if a value of x/(y+z), which represents a ratio of Ca in the contained bivalent metal elements, is smaller than 0.5 and becomes 0.47 (Phosphor 9). For this reason, it may be advantageous that x/(y+z) be larger than 0.5.

Figure 6:
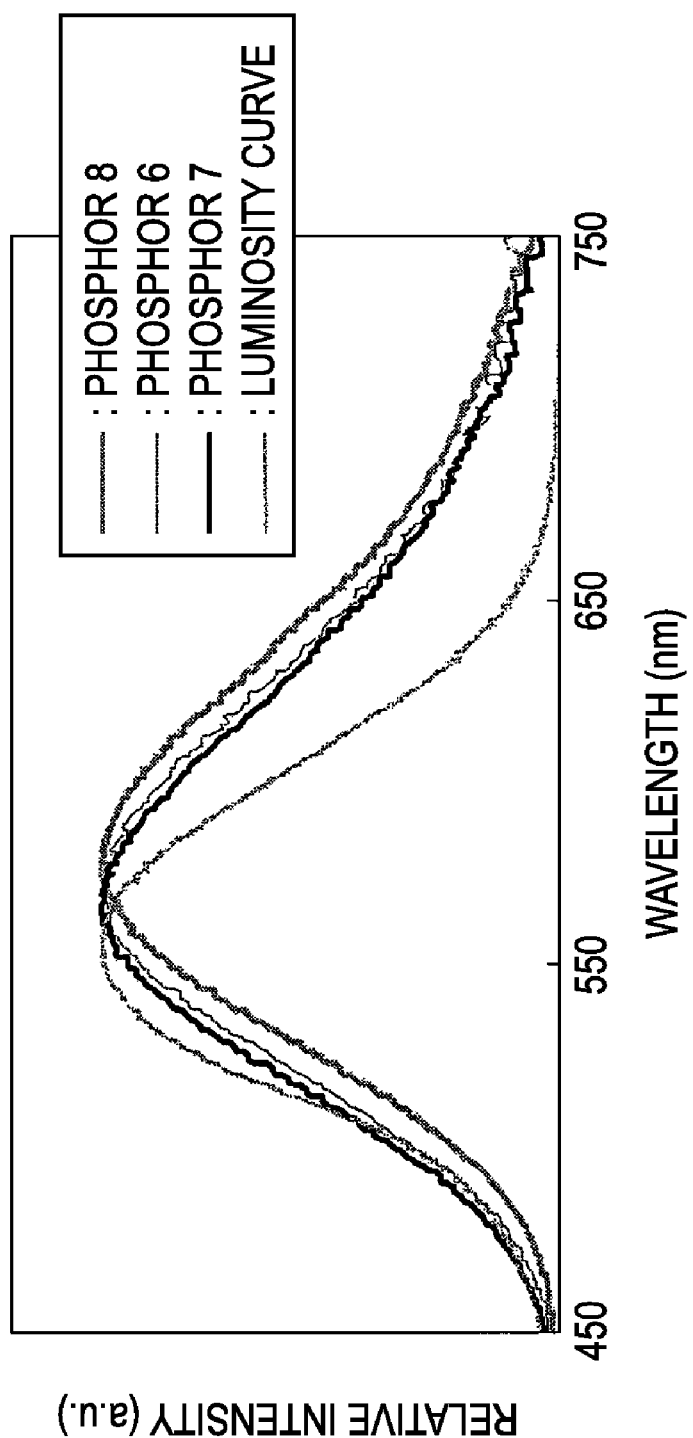
FIG. 6 is a view showing a luminosity curve and emission spectra of Phosphors 6, 7, and 8.

Further, Phosphors 5 to 7 and 10 are examples where $M^1$ is Si, $M^2$ is Ca, $M^3$ is Sr, and $M^4$ is $Eu^{2+}$ in the formula of $(M^2_x, M^3_y, M^4_z)_m M^1 O_3 X_{2/n}$ and not only Cl but also Br is contained as a halogen element X to be contained. As a result, it is found that the peak wavelength of the emission spectrum is shifted toward the short wavelength as the molar ratio ($X_{Br}$) of Br in the contained halogen element is increased (see Table 4). FIG. 6 is a view showing a luminosity curve and emission spectra of Phosphors 6, 7, and 8.

However, it is found that emission intensity is low and a fluorescence property deteriorates if contained $X_{Br}$ exceeds 0.30 and becomes 0.33 (Phosphor 10). That is, it may be advantageous that $X_{Br}$ be 0.3 or less.

As described above, in the phosphor where the contents of elements (Sr and Br) having large ionic radii are larger than those of Phosphor 8 (Comparative example), the peak wavelength of the emission spectrum of the phosphor was shifted toward the short wavelength and light having a wavelength corresponding to good luminosity was emitted. Accordingly, the luminous flux ratio of the phosphor was improved.

The structure of the light emitting device according to the example will be described in detail below.

<Structure of Light Emitting Device>

The light emitting device according to the example is formed by employing the following specific structure in the light emitting device shown in FIG. 1. The structure of the following light emitting device is the same as those of Example and Comparative example except for the kind of a phosphor to be used.

Firstly, an aluminum nitride substrate was used as the substrate 12, and an electrode 14 (positive electrode) and an electrode 16 (negative electrode) were made of gold on the surface of the substrate. An LED (trade name: MvpLED™SL-V-U40AC, manufactured by SemiLEDs, Inc.), which had an emission peak at a wavelength of 405 nm and had an area of 1 mm square, was used as the semiconductor light emitting element 18. Further, the lower surface of the above-mentioned LED was bonded to a silver paste (trade name: 84-1LMISR4, manufactured by Ablestik Laboratories), which was dropped onto the electrode 14 (positive electrode) by a dispenser, and the silver paste was hardened for one hour at a temperature of 175° C. Furthermore, a gold wire having a diameter of 45 μm was used as the wire 22, and the gold wire was bonded to the electrode formed on the upper surface of the LED and the electrode 16 (negative electrode) by ultrasonic thermo-compression bonding. Moreover, a phosphor paste was prepared by mixing 20 vol % of a mixture of various phosphors in a silicon resin (trade name: JCR6140, manufactured by Dow Corning Toray Silicone Co., Ltd.) as the binder member. After being applied to the upper surface of the semiconductor light emitting element 18 so as to have a thickness of 100 μm, the phosphor paste was hardened for 40 minutes at a temperature of 80° C. and then hardened for 60 minutes at a temperature of 150° C. As a result, a phosphor layer 24 was formed.

Light emitting devices according to Example and Comparative example were prepared on the basis of the structure of the above-mentioned phosphor and light emitting device. Meanwhile, Phosphor 11, which was adjusted as follows, was used as the second phosphor which has a color of light that compliments the color of the light emitted from the first phosphor.

Phosphor 11

Phosphor 11 is represented by $(Ca_{4.67}, Mg_{0.5})(PO_4)_3Cl:Eu_{0.08}$. Phosphor 11 is an example of the above-mentioned second phosphor. In the manufacture of Phosphor 11, firstly, the respective raw materials of $CaCO_3$, $MgCO_3$, $CaCl_2$, $CaHPO_4$, and $Eu_2O_3$ were weighed so that the molar ratios thereof satisfied the expression "$CaCO_3:MgCO_3:CaCl_2:CaHPO_4:Eu_2O_3=0.42:0.5:3.0:1.25:0.04$". The respective weighed raw materials were put in an alumina mortar and were pulverized and mixed for about 30 minutes, so that a raw material mixture was obtained. The raw material mixture was put in an alumina crucible, and was fired for 3 hours under a $N_2$ atmosphere containing 2 to 5% of $H_2$ at a temperature of 800° C. to 1200° C. As a result, a fired material was obtained. Phosphor 11 was obtained by deliberately washing the obtained fired material with warm pure water.

Example

Example was formed using Phosphor 2 as the first phosphor and using Phosphor 11 as the second phosphor, and a light emitting device was manufactured by using a phosphor paste where Phosphor 2 and Phosphor 11 were mixed. A mixed phosphor, which was formed by mixing Phosphors 1 and 2 in a weight ratio of 2:1, was used in Example.

Comparative Example

Comparative example was formed using Phosphor 8 as the first phosphor and using Phosphor 11 as the second phosphor, and a light emitting device was manufactured using a phosphor paste where Phosphor 8 and Phosphor 11 were mixed. A mixed phosphor, which was formed by mixing Phosphors 1 and 2 in a weight ratio of 1.5:1, was used in Comparative example.

<Evaluation of Example>

Current of 700 mA was supplied to the light emitting devices according to the Example and the Comparative example in an integrating sphere to make the light emitting devices emit light, and the luminous flux ratio and spectrum of the light emitted from the light emitting devices were measured by a spectroscope (trade name: CAS140B-152, manufactured by Instrument Systems). The measurement results will be described in detail below.

Table 5 shows a luminous flux ratio and chromaticity coordinates (cx and cy) when drive current of 700 mA has been applied to each light emitting device. Meanwhile, a luminous flux ratio is indicated as a relative value assuming that luminous flux measured, when drive current of 700 mA has been applied to the light emitting device according to the Comparative example, is 100.

TABLE 5

| LIGHT EMITTING DEVICE | CHROMATICITY | | LUMINOUS FLUX RATIO |
|---|---|---|---|
| | cx | cy | |
| EXAMPLE | 0.38 | 0.39 | 105 |
| COMPARATIVE EXAMPLE | 0.39 | 0.38 | 100 |

Since yellow visible light emitted from the first phosphor and blue visible light emitted from the second phosphor complement each other, it may also be possible to obtain white light by the light emitting device according to the Comparative example. However, the peak wavelength of Phosphor 8 is formed at a wavelength of 576.0 nm in the emission spectrum of the light emitting device according to the Comparative example. Accordingly, the peak wavelength of Phosphor 8 is deviated from the peak wavelength (555 nm) of the luminosity curve.

In contrast, the peak wavelength of Phosphor 2 is also formed at a wavelength of 575.3 nm in the emission spectrum of the light emitting device according to the Example. Accordingly, the light emitting device according to the Example can emit visible light that has a peak wavelength closer to the peak wavelength (555 nm) of the luminosity curve as compared to the light emitting device according to the Comparative example. As a result, the emission spectrum, which is formed by combining the visible light emitted from the light emitting device according to the Example, has a peak wavelength closer to the peak wavelength of the luminosity curve as compared to the case of the light emitting device according to the Comparative example, thereby obtaining white light having a high luminous flux. Specifically, as shown in Table 5, it is found that the luminous flux ratio of the light emitting device according to the Example is improved by about 5% as compared to that of the light emitting device according to the Comparative example.

Figure 7:
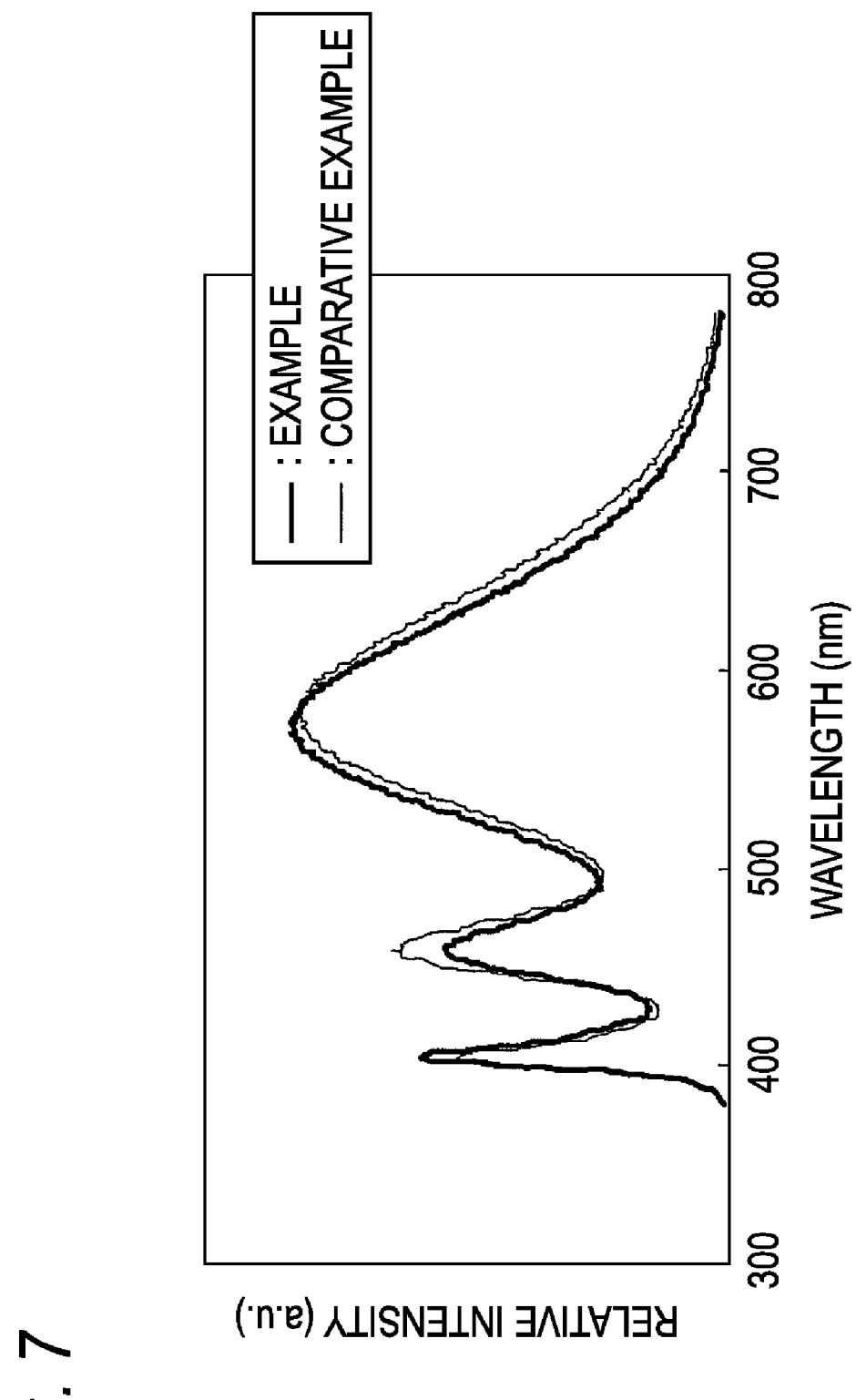
FIG. 7 is a view showing an emission spectrum (thick line) of Example and an emission spectrum (thin line) of Comparative example when drive current of 700 mA is applied to the light emitting device.

FIG. 7 is a view showing an emission spectrum (thick line) of an example and an emission spectrum (thin line) of a Comparative example when a drive current of 700 mA is applied to the light emitting device. Meanwhile, a vertical axis of a graph of FIG. 7 represents relative emission intensity between the Example and the Comparative example. As shown in FIG. 7, the peak wavelength of the light emitting device according to the Example is closer to the peak wavelength (555 nm) of the luminosity curve than that of the light emitting device according to the Comparative example.

The light emitting device according to the invention may be used for various lamps, for example, an illumination lamp, a display, a vehicle lamp, a traffic light, and the like. In particular, it may be expected that the white light emitting device according to the invention is applied to a lamp requiring high-power white light such as a vehicle headlamp.

While the present invention has been shown and described with reference to certain exemplary embodiments thereof, it will be understood by those skilled in the art that various changes in form and details may be made therein without departing from the spirit and scope of the invention as defined by the appended claims. It is aimed, therefore, to cover in the appended claim all such changes and modifications as fall within the true spirit and scope of the present invention.

What is claimed is:

1. A phosphor comprising a composition represented by the formula:

$(M^2{}_x, M^3{}_y, M^4{}_z)_m M^1 O_3 X_{(2/n)}$, wherein $M^1$ is Si and optionally includes at least one element selected from the group consisting of Ge, Ti, Zr, and Sn;

wherein $M^2$ is Ca and optionally includes at least one kind of element selected from the group consisting of Mg, Ba, and Zn;

wherein $M^3$ is Sr and optionally includes at least one kind of element selected from the group consisting of Mg, Ba, and Zn;

wherein X is at least one kind of halogen element;

wherein $M^4$ is $Eu^{2+}$ and optionally includes at least one element selected from the group consisting of rare-earth elements and Mn;

wherein m is in a range of $6/6 \leq m \leq 8/6$; n is in a range of $5 \leq n \leq 7$; and x, y, and z satisfies $x+y+z=1$, where $0<x<1$, $0<y<1$, and $0.01 \leq z \leq 0.3$; and wherein the ionic radii of principal elements of $M^2$, $M^3$, and $M^4$ satisfy $M^2 < M^3 \cong M^4$, and x, y, and z satisfies $0.50 < x/(y+z) < 0.8$.

2. A phosphor comprising a composition represented by the formula:

$(M^2{}_x, M^3{}_y, M^4{}_z)_m M^1 O_3 X_{(2/n)}$, wherein $M^1$ is Si and optionally includes at least one element selected from the group consisting of Ge, Ti, Zr, and Sn;

wherein $M^2$ is Ca and optionally includes at least one kind of element selected from the group consisting of Mg, Ba, and Zn;

wherein $M^3$ is Sr and optionally includes at least one kind of element selected from the group consisting of Mg, Ba, and Zn;

wherein X is at least one kind of halogen element;

wherein $M^4$ is $Eu^{2+}$ and optionally includes at least one element selected from the group consisting of rare-earth elements and Mn;

wherein m is in a range of $6/6 \leq m \leq 8/6$; n is in a range of $5 \leq n \leq 7$; and x, y, and z satisfies $x+y+z=1$, where $0<x<1$, $0<y<1$, and $0.01 \leq z \leq 0.3$; and wherein a principal halogen element of X is Cl, and a ratio $X_{Br}$ of Br in the halogen element X satisfies $0.1 < X_{Br} < 0.3$.

3. A light emitting device comprising:

a light emitting element that emits ultraviolet light or short-wavelength visible light;

a first phosphor that is excited by the ultraviolet light or short-wavelength visible light to emit first visible light; and a second phosphor that is excited by the ultraviolet light or short-wavelength visible light to emit second visible light, wherein the colors of the first visible light and the second visible light complement each other, and white light is obtained by adding and mixing the colors of the first visible light and the second visible light, wherein the first phosphor comprises a composition represented by the formula:

$(M^2{}_x, M^3{}_y, M^4{}_z)_m M^1 O_3 X_{(2/n)}$, wherein $M^1$ is Si and optionally includes at least one element selected from the group consisting of Ge, Ti, Zr, and Sn;

wherein $M^2$ is Ca and optionally includes at least one kind of element selected from the group consisting of Mg, Ba, and Zn;

wherein $M^3$ is Sr and optionally includes at least one kind of element selected from the group consisting of Mg, Ba, and Zn, provided that $M^3$ essentially includes Sr;

wherein X is at least one kind of halogen element;

wherein $M^4$ is $Eu^{2+}$ and optionally includes at least one element selected from the group consisting of rare-earth elements and Mn, wherein m is in a range of $6/6 \leq m \leq 8/6$; n is in a range of $5 \leq n \leq 7$; and x, y, and z satisfies $x+y+z=1$, where $0<x<1$, $0<y<1$, and $0.01 \leq z \leq 0.3$, and wherein the ionic radii of principal elements of $M^2$, $M^3$, and $M^4$ satisfy $M^2 < M^3 \cong M^4$, and x, y, and z satisfies $0.50 < x/(y+z) < 0.8$.

4. A phosphor comprising a composition represented by the formula:

$(M^2{}_x, M^3{}_y, M^4{}_z)_m M^1 O_3 X_{(2/n)}$, wherein $M^1$ is Si and optionally includes at least one element selected from the group consisting of Ge, Ti, Zr, and Sn;

wherein $M^2$ is at least one element selected from the group of Ca and Sr and optionally includes at least one kind of element selected from the group consisting of Ca Mg, Ba, Sr and Zn;

wherein $M^3$ is Sr and optionally includes at least one kind of element selected from the group consisting of Mg, Ba, and Zn;

wherein X is at least one kind of halogen element;

wherein $M^4$ is $Eu^{2+}$ and optionally includes at least one element selected from the group consisting of rare-earth elements and Mn, wherein m is in a range of $6/6 \leq m \leq 8/6$; n is in a range of $5 \leq n \leq 7$; and x, y, and z satisfies $x+y+z=1$, where $0<x<1$, $0<y<1$, and $0.01 \leq z \leq 0.3$ and wherein the ionic radii of principal elements of $M^2$, $M^3$, and $M^4$ satisfy $M^2 < M^3 \cong M^4$, and x, y, and z satisfies $0.50 < x/(y+z) < 0.8$.

5. A light emitting device comprising:

a light emitting element that emits ultraviolet light or short-wavelength visible light;

a first phosphor that is excited by the ultraviolet light or short-wavelength visible light to emit first visible light; and a second phosphor that is excited by the ultraviolet light or short-wavelength visible light to emit second visible light, wherein the colors of the first visible light and the second visible light complement each other, and white light is obtained by adding and mixing the colors of the first visible light and the second visible light, wherein the first phosphor comprises a composition represented by the formula:

$(M^2{}_x, M^3{}_y, M^4{}_z)_m M^1 O_3 X_{(2/n)}$ wherein $M^1$ is Si and optionally includes at least one element selected from the group consisting of Ge, Ti, Zr, and Sn;

wherein $M^2$ is Ca and optionally includes at least one kind of element selected from the group consisting of Mg, Ba, and Zn;

wherein $M^3$ is Sr and optionally includes at least one kind of element selected from the group consisting of Mg, Ba, and Zn, provided that $M^3$ essentially includes Sr;

wherein X is at least one kind of halogen element;

wherein $M^4$ is $Eu^{2+}$ and optionally includes at least one element selected from the group consisting of rare-earth elements and Mn, wherein m is in a range of $6/6 \leq m \leq 8/6$; n is in a range of $5 \leq n \leq 7$; and x, y, and z satisfies $x+y+z=1$, where $0 < x < 1$, $0 < y < 1$, and $0.01 \leq z \leq 0.3$, and wherein a principal halogen element of X is Cl, and a ratio $X_{Br}$ of Br in the halogen element X satisfies $0.1 < X_{Br} < 0.3$.

6. A phosphor comprising a composition represented by the formula:

$$(M^2{}_x, M^3{}_y, M^4{}_z)_m M^1 O_3 X_{(2/n)},$$

wherein $M^1$ is Si and optionally includes at least one element selected from the group consisting of Ge, Ti, Zr, and Sn;

wherein $M^2$ is at least one element selected from the group of Ca and Sr and optionally includes at least one kind of element selected from the group consisting of Ca Mg, Ba, Sr and Zn;

wherein $M^3$ is Sr and optionally includes at least one kind of element selected from the group consisting of Mg, Ba, and Zn;

wherein X is at least one kind of halogen element;

wherein $M^4$ is $Eu^{2+}$ and optionally includes at least one element selected from the group consisting of rare-earth elements and Mn, wherein m is in a range of $6/6 \leq m \leq 8/6$; n is in a range of $5 \leq n \leq 7$; and x, y, and z satisfies $x+y+z=1$, where $0 < x < 1$, $0 < y < 1$, and $0.01 \leq z \leq 0.3$, and wherein a principal halogen element of X is Cl, and a ratio $X_{Br}$ of Br in the halogen element X satisfies $0.1 < X_{Br} < 0.3$.

* * * * *